United States Patent [19]

Hirao

[11] 4,392,066
[45] Jul. 5, 1983

[54] SCHMIDT TRIGGER CIRCUIT

[75] Inventor: Hiroshi Hirao, Kawasaki, Japan

[73] Assignee: Fujitsu Limited, Kanagawa, Japan

[21] Appl. No.: 219,496

[22] Filed: Dec. 23, 1980

[30] Foreign Application Priority Data

Dec. 29, 1979 [JP] Japan .................. 54/171184

[51] Int. Cl.³ .............. H03K 3/295; H03L 1/00
[52] U.S. Cl. ................. 307/290; 307/297;
307/304; 307/603
[58] Field of Search ........... 307/290, 594, 597, 603,
307/297, 304

[56] References Cited

U.S. PATENT DOCUMENTS 3,407,339 10/1968 Booher .
3,678,293 7/1972 Popper .
3,714,466 1/1973 Spence .
3,873,856 3/1975 Gerlach et al. .................. 307/279
3,959,782 5/1976 Dunn .
4,000,427 12/1976 Hoffmann .
4,101,788 7/1978 Baker .
4,115,710 9/1978 Lou ............................. 307/304

Primary Examiner—John Zazworsky
Attorney, Agent, or Firm—Staas & Halsey

[57] ABSTRACT

In a Schmidt trigger circuit for delaying a signal, means are provided to reduce an undesirable time lag in the discharge of charges stored in a node. The node of interest is connected to the gate of a feed-back transistor to supply a bias voltage to its gate. The node may be charged up to a high level by an abnormal rise of the power source level, and be held at that high level regardless of a subsequent lowering of the power source level to cause a time lag in the lowering of said high level at the time of discharging said charges stored at the node. Such delay is undesirably large. To reduce said time lag a transistor is connected between the node and the power source line such that when the level difference therebetween exceeds the threshold voltage of the transistor, the transistor is turned ON to discharge therethrough charges of the node to the power source line.

5 Claims, 7 Drawing Figures

SCHMIDT TRIGGER CIRCUIT

BACKGROUND OF THE INVENTION

1. Field of the Invention

The present invention relates to an improvement in a Schmidt trigger or related type circuit which is commonly employed for delaying a signal, for example, in a dynamic MIS memory circuit.

2. Description of the Prior Art

An MIS transistor having a gate electrode formed by polycrystalline silicon is used as a memory cell in a dynamic MIS memory circuit.

Polycrystalline silicon has an appreciably high resistance as compared with Al and other wiring materials. Accordingly, when a drive circuit disposed on one side of a memory cell array is connected with the gate electrode of an MIS transistor forming each memory cell of the memory cell array, for example, in the case of reading them out, information can immediately be read out from the memory cells lying near the drive circuit, but the reading out of information from memory cells situated away from the drive circuit is delayed because the high resistance property of the polycrystalline silicon and the presence of a capacitance cause a time lag in the transmission of a signal to such memory cells from the drive circuit. Therefore, if an output circuit for outputting the read-out information is driven by the same signal as that applied to each memory cell, notwithstanding that the time for reading out the information varies with the position of the memory cell, then accurate information can not be obtained.

To avoid this, there has been proposed such a circuit arrangement as shown in FIG. 1.

In FIG. 1, reference numeral 1 indicates a pre-stage clock generator; 2 designates a memory cell array; 3 identifies an output circuit; 4 denotes a Schmidt trigger circuit; and 5 represents a post-stage clock generator.

The pre-stage clock generator 1 is utilized to convert an external input of the TTL (Transistor-Transistor Logic) level to a MIS level and to generate clock signals $\phi_1$, $\phi_2$, ... (such as shown in FIGS. 1, 2, 3, and 6) for driving other circuits.

The operation of the circuit shown in FIG. 1 can be understood by reference to FIG. 2 which shows the potential variations. The pre-stage clock generator 1, supplied with an external input, applies the clock signal $\phi_2$ to the gate electrodes of the memory cells of the memory cell array 2, that is, a word line, thus selecting a desired one of the memory cells. Since the word line is made of polycrystalline silicon as mentioned previously, it has a large resistance value and also a parasitic capacitance; accordingly, when a memory cell connected to a far end of the word line is selected, much time is required for applying a sufficient voltage to the memory cell and reading out therefrom information on a bit line at a required level. As can be seen from FIG. 2, an appreciable time lag exists until the potential of the bit line falls sufficiently below a reference level which is dependent on the output circuit 3, after the application of the clock signal $\phi_2$ to the word line. Consequently, if the output circuit 3 is driven by the clock signal $\phi_2$, then erroneous information is outputted. To avoid this, in the circuit of FIG. 1 the clock signal $\phi_2$ is delayed by the Schmidt trigger circuit 4 and then provided to the post-stage clock generator 5 to derive therefrom a clock signal $\phi_2'$ which lags the clock signal $\phi_2$ by a predetermined time and the clock signal $\phi_2'$ is applied to the output circuit 3 to activate it, thereby obtaining accurate information.

A specific circuit arrangement of the Schmidt trigger circuit 4 as used in FIG. 1 is shown in FIG. 3.

In FIG. 3, $Q_1$ to $Q_4$ indicate first to fourth transistors; R designates a resistor; C identifies a capacitor; $N_1$ to $N_3$ denote first to third nodes; A and B represent input terminals; $O_T$ shows an output terminal; Vcc refers to a power source level; Vss indicates the ground level; and $\phi_1$ and $\phi_2$ designate clock signals.

This circuit does not pose any problem in its normal operation but has certain disadvantages in case of a variation in the power source level Vcc. This will be described with reference to FIGS. 4 and 5.

Referring first to FIG. 4, a description will be given of the normal operation of the Schmidt trigger of FIG. 3, in which the power source level Vcc does not vary. Now, let it be assumed that the circuit operates at a power source level $Vcc_2$ shown in FIG. 4. Upon application of the clock signal $\phi_1$ to the input terminal B, the transistor $Q_1$ is turned ON to charge up the node $N_1$ and its level becomes $Vcc_2 - Vth(Q_1)$, where $Vth(Q_1)$ is the threshold voltage of the transistor $Q_1$.

When the node $N_1$ is charged up, the transistors $Q_4$ is turned ON to charge up the node $N_2$ and its level becomes $Vcc_2 - Vth(Q_1) - Vth(Q_4)$, where $Vth(Q_4)$ is the threshold voltage of the transistor $Q_4$.

After the nodes $N_1$ and $N_2$ have thus been charged up, the clock signal $\phi_1$ at the input terminal B assumes a low level and then the clock signal $\phi_2$ is provided to the input terminal A. As a consequence, the node $N_3$ is charged up but its rising-up waveform becomes a gentle slope as shown due to the time constant of the resistor R and the capacitor C. This gentle rise due to the time constant achieves a desired time lag.

When the node $N_3$ is charged up in excess of the threshold voltage $Vth(Q_3)$ of the transistor $Q_3$, the transistor $Q_3$ is turned ON, with the result that charges stored at the node $N_2$ are discharged and its level starts to drop. At this moment, however, since the transistor $Q_4$ is still in the ON state in which to supply a current to the node $N_2$, the level of the node $N_2$ drops in dependence on the gm ratio between the transistors $Q_3$ and $Q_4$. Usually, in the case where gm of the transistor $Q_3$ is 1, gm of the transistor $Q_4$ is selected about 10, so that the level of the node $N_2$ falls appreciably gently.

When the level of the node $N_2$ drops to such an extent that the level difference between the nodes $N_2$ and $N_3$ exceeds the threshold voltage $Vth(Q_2)$ of the transistor $Q_2$, the transistor $Q_2$ is turned ON and the level of the node $N_1$ starts to drop.

Thus, in the Schmidt trigger circuit shown in FIG. 3, one of the important functions of the circuit is to slow the discharge at the node $N_2$ by the time constant $(C \times R)$ and the current feedback from the transistor $Q_4$ to the node $N_2$, thereby achieving a time lag. Because of the current feedback from the transistor $Q_4$ to the node $N_2$, the level of the node $N_1$ does not drop unless the level of the node $N_3$ becomes appreciably high, that is, unless the level of the node $N_3$ exceeds the sum of the level of the node $N_2$ and the threshold voltage $Vth(Q_2)$. In other words, the circuit operates after the level of the word line (see FIG. 2) rises sufficiently high, and accordingly, at that moment the level of the word line rises high above the reference level. It is also an important function of the circuit of FIG. 3 to obtain a sufficient level margin of the bit line by detecting the level of the word line as described above.

Next, a description will be given, with reference to FIG. 5, of an abnormal operation wherein the power source level Vcc fluctuates.

Now, let it be assumed that the circuit operates at a power source level $Vcc_1$ shown in FIG. 5, where $Vcc_1 > Vcc_2$.

Upon application of the clock signal $\phi_1$, the nodes $N_1$ and $N_2$ are charged up as in the case described above.

Next, assume that before the application of the clock signal $\phi_2$, the power source level $Vcc_1$ falls down to the power source level $Vcc_2$, $Vcc_2$ being lower than the charge-up level of the node $N_1$, as indicated by the broken line D. At this time, however, the clock signal $\phi_1$ has already fallen and the transistor $Q_1$ is in the OFF state, so that charges stored at the node $N_1$ are not discharged on the power source line at voltage $Vcc_2$ and the level of the node $N_1$ remains unchanged; in this case, the level at node $N_1$ stays at the higher level to which the node $N_1$ was charged up when the power source level was $Vcc_1$, instead of the power source level $Vcc_2$. As a result of this, a high bias voltage is applied to the transistor $Q_4$, increasing a charge-up current to the node $N_2$.

The gm ratio between the transistors $Q_3$ and $Q_4$ is usually about 1 to 10. However, when the current to the node $N_2$ is large as mentioned above, the apparent gm ratio becomes as large as 1 to 15~20, so that even if the clock signal $\phi_2$ is applied at this time, the level drop of the node $N_2$ is slowed down, resulting in the discharge of the node $N_1$ being also delayed.

This delay is indicated by $t_1$ in FIG. 5. When such a time lag occurs, the delivery of the clock signal $\phi_2'$ from the post-stage clock generator 5 is delayed and the generation of information from the output circuit 3 is also delayed, resulting in the access operation being slowed down as a whole.

SUMMARY OF THE INVENTION

Accordingly, it is an object of the present invention to overcome the above mentioned disadvantages. It is another object of the present invention to provide a Schmidt trigger circuit which can reduce a delay of the access operation resulting from a variation in the power source level.

Briefly stated, according to the present invention, in a Schmidt trigger circuit which is provided with at least first, second and third transistors connected in series between a power source line and a ground line, and a fourth transistor which is controlled by the potential at a first node of the connection of the first and second transistors, said potential at the first node providing a feedback current to a second node at the junction of the second and third transistors through said fourth transistor, there is provided a fifth transistor which is connected between the power source line and the first node.

DESCRIPTION OF THE PREFERRED EMBODIMENTS

It is the basic concept of the present invention that when the power source level Vcc drops, the potential at the node $N_1$ is lowered correspondingly.

Figure 1:
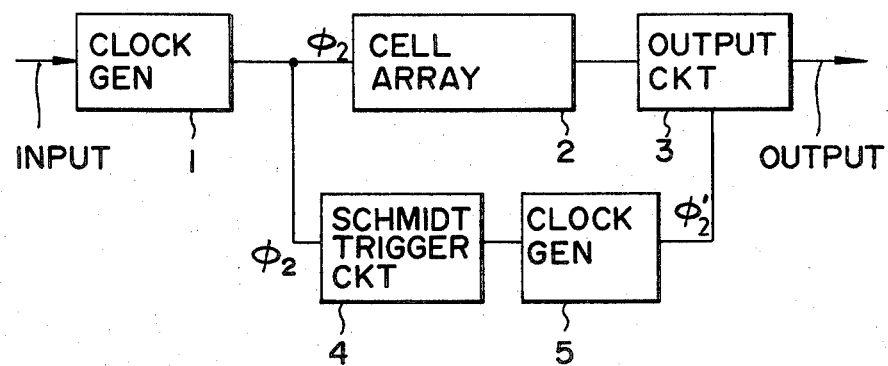
FIG. 1 is a block diagram explanatory of how a Schmidt trigger circuit is used.
Figure 2:
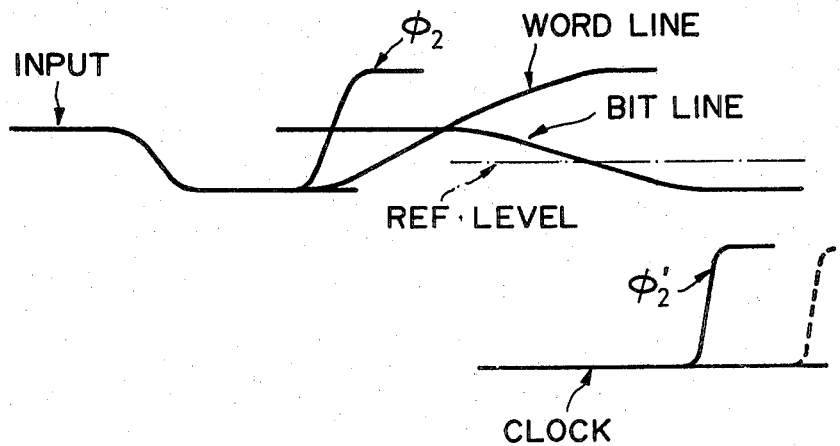
FIG. 2 is a schematic diagram showing variations in potential levels at critical positions of the circuit shown in FIG. 1.
Figure 3:
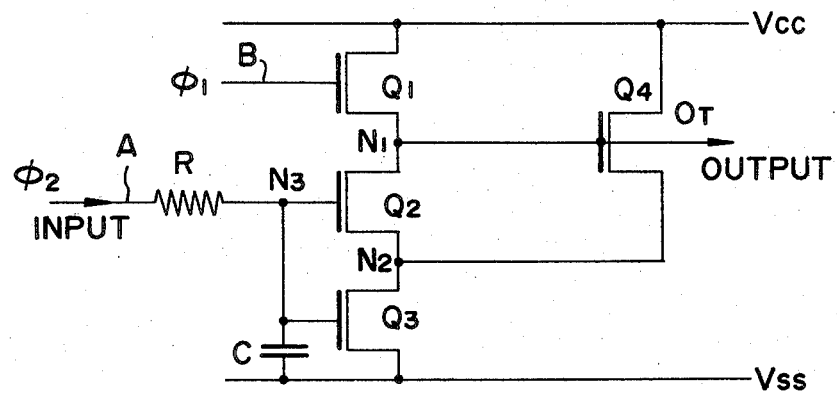
FIG. 3 is a circuit diagram showing the principal part of a prior art example.
Figure 6:
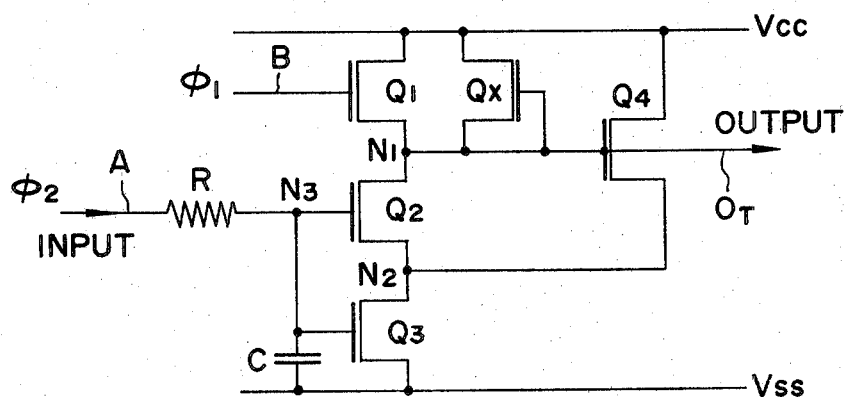
FIG. 6 is a circuit diagram illustrating the principal part of an embodiment of the present invention.
Figure 4:
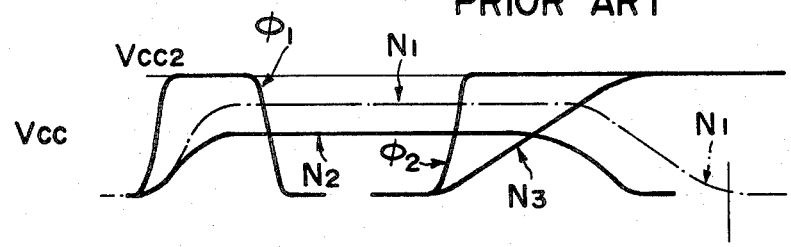
FIG. 4 is a schematic diagram showing variations in the potential levels at the critical positions of the circuit of FIG. 3, explanatory of its normal operation.
Figure 5:
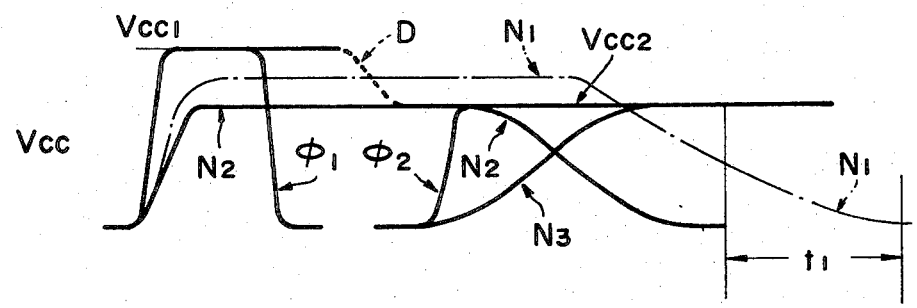
FIG. 5 is a schematic diagram showing variations in the potential levels at the critical positions of the circuit of FIG. 3, explanatory of its abnormal operation.

FIG. 6 illustrates an embodiment of the present invention, in which the parts corresponding to those in FIG. 3 are identified by the same reference symbol.

The illustrated embodiment differs from the prior art example of FIG. 3 in that a fifth transistor $Q_x$ is provided, as shown. The transistor $Q_x$ has its drain connected to the power source line and its gate and source connected to the node $N_1$. It is preferred that the transistor $Q_x$ has a low threshold voltage $Vth(Q_x)$.

Figure 7:
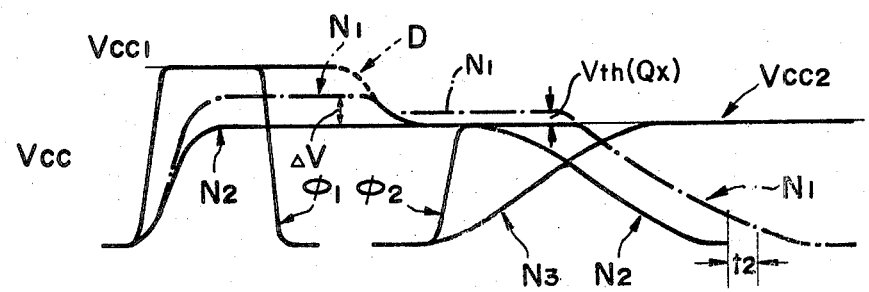
FIG. 7 is a schematic diagram showing variations of potential levels at critical positions of the circuit of FIG. 6, explanatory of its abnormal operaton.

Next, a description will be given, with reference to FIG. 7, of the abnormal operation wherein the power source level Vcc varies.

Now, assuming that the nodes $N_1$ and $N_2$ are charged up in the state of the circuit operating at the power source level $Vcc_1$ and that the power source level drops down to $Vcc_2$ afterward, the potential level of the node $N_1$ becomes higher than the power source level $Vcc_2$, providing therebetween a potential difference $\Delta V$. When the potential difference $\Delta V$ exceeds the threshold voltage $Vth(Q_x)$ of the transistor $Q_x$, the transistor $Q_x$ is turned ON, through which charges stored at the node $N_1$ are discharged onto the power source line to lower the potential level of the node $N_1$ to be substantially equal to $Vcc_2 + Vth(Q_x)$. In this way, the potential level of the node $N_1$ drops very rapidly as compared with the potential drop in the conventional circuit, and consequently the time for the potential of the node $N_1$ to reach the zero level is markedly reduced, as indicated by $t_2$.

As will be appreciated from the foregoing description, according to the present invention, in a Schmidt trigger circuit which is provided with at least first, second and third transistors connected in series between the power source level line and the ground level line, and a fourth transistor which is controlled by the potential at a first node formed at the connection of the first and second transistors to apply a feedback current to a second node at the connection of the second and third transistors, the provision of a fifth transistor between the power source level line and the first node prevents the level of the first node from becoming abnormally high as compared with the level of the power source level line. When the power source level falls below the level of the first node, the latter is immediately lowered also; accordingly, it is possible to reduce a delay of the access operation which results from a variation in the power source level.

It will be apparent that many modifications and variations may be effected without departing from the scope of the novel concepts of this invention.

What is claimed is:

1. In a Schmidt trigger circuit which is provided with at least first, second and third transistors which are series-connected at their respective sources and drains between a power source line and a ground line, and a fourth transistor which has its gate connected to a first node at the series connection of the first and second transistors to apply a feedback current from the drain of said fourth transistor to a second node at the series connection of the second and third transistors, the improvement comprising a fifth transistor connected between the power source line and the first node, wherein said fifth transistor allows said first node to discharge to said power source line when, after said first node is charged to a voltage corresponding to an initial voltage of said power source line, said voltage of said power source line decreases to a level below a level corresponding to said voltage on said first node, whereby variations in a time delay provided by said Schmidt trigger circuit, as a result of the variation in the voltage of said power source line, may be reduced.

2. The circuit of claim 1, said fifth transistor having its drain connected to said power source line, and its gate and its source connected to said first node.

3. The circuit of claim 1 or 2, comprising
means for providing a first clock signal to the gate of said first transistor to charge said first node to said voltage corresponding to said initial voltage on said power source line, and
means for providing a second clock signal to the gates of said second and third transistors, with a predetermined delay corresponding to said delay time.

4. The circuit of claim 1 or 2, said voltage of said first node corresponding to said initial voltage of said power source line being equal to said initial voltage of said power source line minus the threshold voltage of said first transistor, and the voltage of said first node after said discharging to said power source line being equal to the decreased voltage on said power source line plus the threshold voltage of said fifth transistor.

5. The circuit of claim 3, said voltage of said first node corresponding to said initial voltage of said power source line being equal to said initial voltage of said power source line minus the threshold voltage of said first transistor, and the voltage of said first node after said discharging to said power source line being equal to the decreased voltage on said power source line plus the threshold voltage of said fifth transistor.

* * * * *

UNITED STATES PATENT AND TRADEMARK OFFICE
CERTIFICATE OF CORRECTION

PATENT NO. : 4,392,066
DATED : 5 July 1983
INVENTOR(S) : HIROSHI HIRAO

It is certified that error appears in the above-identified patent and that said Letters Patent is hereby corrected as shown below:

Front page, [73] Assignee, "Kanagawa" should be --Kawasaki--.

Column 2, line 24, "transistors" should be --transistor--.

Signed and Sealed this

Sixth Day of December 1983

[SEAL]

Attest:

GERALD J. MOSSINGHOFF

Attesting Officer     Commissioner of Patents and Trademarks